United States Patent [19]

Cordwell et al.

[11] Patent Number: 4,943,786
[45] Date of Patent: Jul. 24, 1990

[54] DIGITAL CONTROL OF PHASE LOCKED LOOPS

[75] Inventors: Brian Cordwell; Paul M. Hayes, both of Dorset, Great Britain

[73] Assignee: Plessey Overseas Limited, Essex, England

[21] Appl. No.: 240,425

[22] Filed: Sep. 1, 1988

Related U.S. Application Data

[60] Continuation-in-part of Ser. No. 87,071, Oct. 23, 1987, abandoned, which is a division of Ser. No. 807,629, Dec. 11, 1985, Pat. No. 4,692,713.

[30] Foreign Application Priority Data

Dec. 21, 1984 [GB] United Kingdom ............... 8432552

[51] Int. Cl.$^5$ .......................... H03L 7/08; H03M 1/70
[52] U.S. Cl. .................................... 331/1 A; 328/27; 331/17; 331/25; 365/94; 365/191; 365/230.03
[58] Field of Search ...................... 365/94, 191, 230.3; 331/1 A, 17, 25; 328/27

[56] References Cited

U.S. PATENT DOCUMENTS

| | | | |
|---|---|---|---|
| 4,318,188 | 3/1982 | Hoffmann | 365/45 |
| 4,367,456 | 1/1983 | Munter | 340/347 C |
| 4,594,690 | 6/1986 | Meyers et al. | 365/230 |
| 4,692,713 | 9/1987 | Cordwell et al. | 365/230.03 X |

FOREIGN PATENT DOCUMENTS

| | | |
|---|---|---|
| 2468917 | 8/1979 | France . |
| 2102603 | 7/1982 | United Kingdom . |
| 2109135 | 10/1982 | United Kingdom . |

OTHER PUBLICATIONS

Patent Abstracts of Japan, vol. 9, No. 4 (E-288)(1727), Jan. 10, 1985 Re. JP-A-59 15 334 (Toshiba K. K.) 01-0-9-1984 Abstract: figure.
IBM Technical Disclosure Bulletin, vol. 18, No. 8, Jan. 1976, pp. 2536-2537, New York, US; A. Dauby et al.: "Pulse Code Modulation Word Adder" pp. 2536, line 4-p. 2537, line 4; table.

Primary Examiner—Joseph A. Popek
Attorney, Agent, or Firm—Michael F. Oglo; Julian C. Renfro

[57] ABSTRACT

A control circuit, particularly for use in a phase-locked loop includes a read-only memory (ROM) having n address inputs divided into two groups, each group being addressed by first (A) and second (B) signals, and the memory device having words preprogrammed therein to provide an output having values (C) of a predetermined function of the first and second signals. In one embodiment the control circuit is employed in a phase-locked loop where one address group provides an analog version of the first signal to a voltage controlled oscillator, and application of the second signal to the second address group permits a step change in the output voltage to the VCO. In another embodiment, the first and second signals may comprise carrier signals and modulating signals in a phase-locked loop employed for frequency modulation.

7 Claims, 3 Drawing Sheets

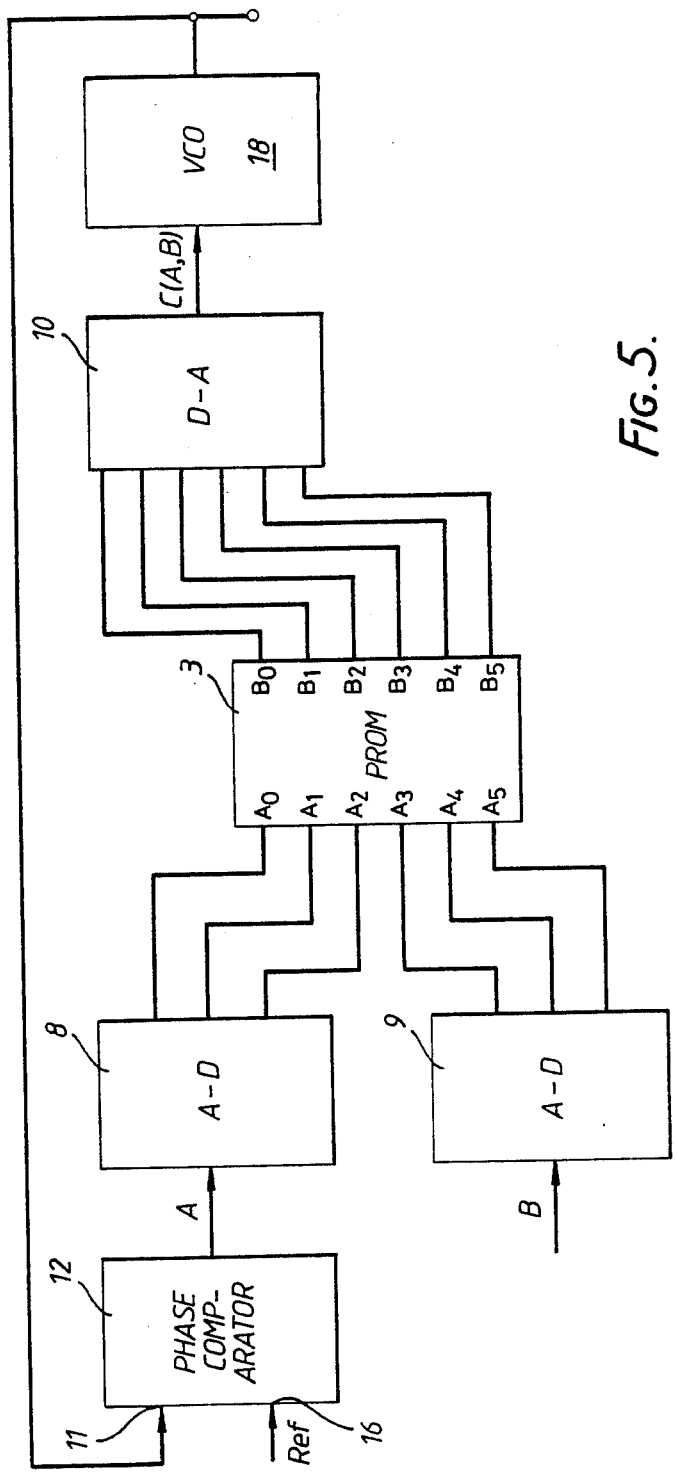

DIGITAL CONTROL OF PHASE LOCKED LOOPS

This application is a continuation-in-part of our prior application, U.S. Ser. No. 07/087,071 filed Oct. 23, 1987 in the names of Brian Cordwell and Paul M. Hayes, now abandoned which is a division of application Ser. No. 807,629, filed on Dec. 11, 1985, now U.S. Pat. No. 4,692,713.

The present invention relates to control circuits and more particularly to control circuits which provide a plurality of digitally encoded electrical signal outputs.

In many control applications digital signals are received from a part of an electrical or electronic circuit which have an effect on another part of that circuit to alter the ultimate output thereof. In some cases the received digital signals are of the kind known as "feedback" signals returned from a comparison device which compares the output of the circuit with a fixed reference.

One well known kind of circuit which utilizes feedback signals is a phase-lock loop in which an output signal generated by an oscillator is compared in phase and/or frequency with an input signal. A digital signal from the comparison device is then used to control the frequency of the oscillator. For example a digital-to-analogue converter may be used to convert the signal from the comparison device to an analogue voltage which is used to control a voltage controlled oscillation.

However, if a significant phase difference is present the time taken to adjust the output phase of the oscillator may be comparatively long. It would be advantageous to provide a rapid change to the control to effect a brief increase or decrease in the output oscillation to bring the output into phase alignment. When a digital-to-analogue converter is used to generate the increasing the digital information rate which is not always easy to provide.

It is an object of the present invention to provide a simple control circuit capable of providing a digital control signal output the digital value of which may be changed more rapidly than was practical in the earlier systems outlined above.

It is a further object of the invention to provide a control circuit capable of providing a digital control signal output in response to two or more control inputs.

According to the present invention, there is provided a control circuit comprising a signal translating device, the device having n binary signals inputs and a predetermined number of binary signal outputs;

the inputs comrpising first and second groups, first and second signal means for applying first (A) and second (B) binary signals to the inputs of the respective first and second address groups, each group comprising at least one input of the device;

the device including signal translating means such that output binary signals are provided which are predetermined function (C) of the first and signals.

The signals translating device may take any appropriate form, for example hard-wired logic gates having n binary signals inputs and a predetermined number of binary signal outputs.

In a preferred form, the signals translating device comprises a programmable device such that the device may be set up with a specific relation between the input and output signals. As preferred, the programmable device is a programmable memory device (such as EPROM) having words preprogrammed therein which are addressed by the first and second input groups to provide output values at said outputs which represent values of a predetermined function of the first and second signals. The advantage of using a programmable device is that the device may readily be adapted to a specific application.

In accordance with the invention, the first signal may be scaled against the second signal by any desired function, the ouput from the signal translating device representing the scaled value. Thus if the output of the signal translating device is represented by C, and the input signals by A and B $C = f(A, B)$.

By way of example, $C = A \, (kB)^{\pm 1}$ where k is a constant factor.

The signals A and B may be converted to digital from analog form by the use of D/A converters, and the signal C may be converted to analog form by an A/D converter.

As preferred, the control circuit according to the invention may be employed in a phase locked loop where the memory device provides an output to a voltage controlled oscillator whose output is compared in a phase comparator with a reference signal, the result of the comparison being applied as said first signal to the first address group. A frequency modulation signal is applied as the second signal to the second address group so that the output from the voltage controlled oscillator represents a signal frequency modulated onto a carrier signal.

As an alternative, the control circuit according to the invention may be employed in a phase-locked loop which is employed for clock recovery in a telecommunication system.

According to a specific aspect of the present invention there is provided a control circuit comprising: an addressable memory device, storage capacity of which is programmed in two areas of equal address length; the circuit being arranged to cause output of a digital word from the memory device in dependance upon digital signals applied to address inputs thereof; one of the programmed areas storing a first plurality of digital words arranged in an address orde and the other of said programmed areas storing a second plurality of digital words arranged in a corresponding address order; words stored in corresponding address locations of the two areas having a predetermined difference between each other; and, the memory device is arranged to output an addressed word from one of the areas when a signal is present on a particular one of said address inputs and to output an addresed word from the other of the areas when a signal is not present on said particular one of said address inputs whereby application or removal of a signal from said particular one of said address inputs effects a predetermined step change in the digital value of the output of the control circuit.

Preferably one of said areas is programmed with each of said digital words identical with its address such that when said signal on said particular one of said address inputs is not present the memory device appears transparent to the applied digital input signals.

Further areas of equal address length may also be provided with words stored in corresponding locations in each such area having a different predetermined difference from the words stored in the first said programmed area whereby a plurality of selectable predetermined step changes in the digital output of the control circuit may be achieved.

In one embodiment the control circuit also comprises a digital-to-analogue converter supplied by the output of said memory device whereby a step change may be produced in an analogue voltage output.

According to a specific feature of the invention there is provided a signal generator comrprising a volatge controlled oscillator, a phase detector responsive to comparison between the output signal of the oscillator and a reference signal to produce a digital output signal representing any phase difference therebetween a control circuit in accordance with the invention responsive to the digital output of the phase detector to provide a respective digital output signal, and a digital to analogue converter responsive to the digital output signal from said control circuit to provide a voltage signal to control the output frequency of the oscillator such that any significant phase difference may be corrected by application of a single additional inout to the control circuit to cause a step change in the voltage output of the digital to analogue converter thereby, causing a step change in the output frequency of said oscillator.

A control circuit and a signal generator in accordance with the invention will now be described by way of example only with reference to the accompanying drawings of which:

Figure 1:
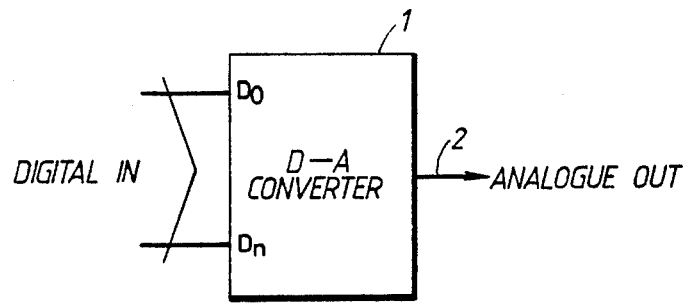
FIG. 1 is a schematic diagram of a digital to analogue converter.

Referring to FIG. 1 a digital to analogue converter 1 operating in known manner is shown. In the digital-to-analogue converter 1 a digital signal present at the input Do-Dn (usually in binary form) provides a voltage output signal on a single output lead 2. The voltage output signal varies in dependence upon the digital value of the signal at the input with say a binary signal of all zero (0) values at the input Do-Dn being represented by say a zero voltage at the output 2 and a binary signal of all one (1) values at the input Do-Dn being represented by, say, five volts at the output 2. Intermediate values of the input signal provide correspondingly scaled output voltages.

To produce a 'step' change in the output voltage it is necessary to provide a significant change in the digital value of the input signal applied to the input leads Do-Dn. If, say, a one volt step is required at the output 2 the digital value applied at the input leads Do-Dn must be changed rapidly to a new value and the value change required may vary in dependence upon the position of the value between the minima and maxima.

Figure 2:
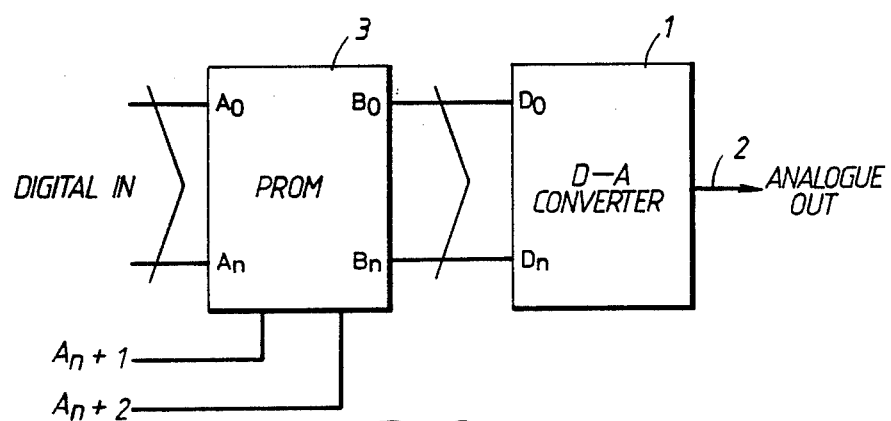
FIG. 2 is a schematic diagram of a control circuit in accordance with the invention, shown in use with the digital to analogue converter of FIG. 1.

Referring to FIG. 2 the control circuit shown can simply and effectively provide step changes in the voltage at the output 2 by varying the digital input on the leads Do-Dn.

Thus address inputs Ao-An of a programmable read-only-memory (PROM) 3 receive the same circuit signals as those applied to Do-Dn of the digital to analogue converter 1. In addition to the address inputs Ao-an, other address inputs A(n+1) and A(n+2) of the PROM 3 are used.

The storage of the PROM 3 is programmed such that words addressed by signals on the inputs Ao-An when the inputs A(n+1) and A(n+2) carry the binary representation '0' output their address value to output leads Bo-Bn thereby providing that digital value to the inputs Do-Dn of the digital to analogue converter 2. Thus the PROM 3 appears "transparent" to the signals and a circuit including the PROM 3 with digital to analogue converter 1 will function in exactly the same manner as if only the digital to analogue converter 1 was present.

However, should it be necessary to effect an adjustment of the value supplied to the digital to analogue converter such adjustment may be effected by programming the words addressed by Ao-An with A(n+1) and A(n+2) to effect that adjustment.

It will be appreciated that, in the case of the PROM 3 having two additional address leads A(n+1) and A(n+2) and assuming that binary addressing is being used, only one quarter of the available memory space has been occupied.

Accordingly the words addressed when A(n+1) is at binary value '1' and A(n+2) is at binary value '0', when A(n+1) is at binary value '0' and A(n+2) is at binary value '1' and when both A(n+1) and A(n+2) are at binary value '1' are available as three "stores" equal in size to the memory space already occupied.

Thus each of these additional stores is programmed to reflect a step change in the value of the digital output on leads Bo-Bn thereby effecting a step change in the output voltage at the output 2.

Consider as an example a PROM having six address inputs A0 to A6 and three outputs D0-D3 then the PROM may be programmed to provide a fixed difference in the digital output value in accordance with the following table:

| Date In | Operands | | | Data Out |
|---------|---|---|---|----------|
| A0–A3 | A4, A5, A6 | | | D0–D3 |
| DATA | 0 | 0 | 0 | DATA |
| DATA | 0 | 1 | 0 | DATA − One (decimal) |
| DATA | 1 | 1 | 0 | DATA + One (decimal) |
| DATA | 0 | 1 | 1 | DATA − Ten (decimal) |
| DATA | 1 | 1 | 1 | DATA + Ten (decimal) |

In this case only five of the possible eight combinations of the operands A4–A6 have been used thus three further output variations may be provided. However, if only five variants are required the stored words provided by the "surplus" addresses may be programmed to output A0 to A3 in the same manner as when A4, A5 and A6 are at zero.

When the PROM 3 is programmed in the manner shown it will be appreciated that it may be used to provide fine and coarse adjustments of the output. Thus A5 being set to '1' indicates that an output "step" is required A4 indicates when '0' that a negative "step" is required and when set to '1' that a positive step is required and A6 indicates that the step is to be fine (plus or minus one decimal) or coarse (plus or minus ten decimal) for '0' and '1' respectively.

In an alternative mode of operation percentage steps may be used in the same manner. Thus memory space of the PROM 3 addressed by "000A3A2A1Ao" may output as aforesaid whilst "010A2A1Ao" may output (AoA1A2A3 less five percent) and "011A3A2A1Ao" may output (AoA1A2A3 plus five percent). A "coarse" adjustment of, say, fifteen percent may be provided when A6 is set to 1.

It will be realised that other scaling adjustment may also be used possibly with a variation of the adjustment across the address range or with adjustment being effected only for certain areas of the address range.

Whilst as hereinbefore described adjustment is effected by use of the most significant bits of the address input Ao-an A(n+1) a(n+2) it will be appreciated that any one or more of the address bits may be used to effect such adjustment since for example groups of words in the PROM 3 may all relate to one particular basic address value, the most significant bits of the address being used for basic addressing and the least significant bits being used for data adjustment.

Figure 3:
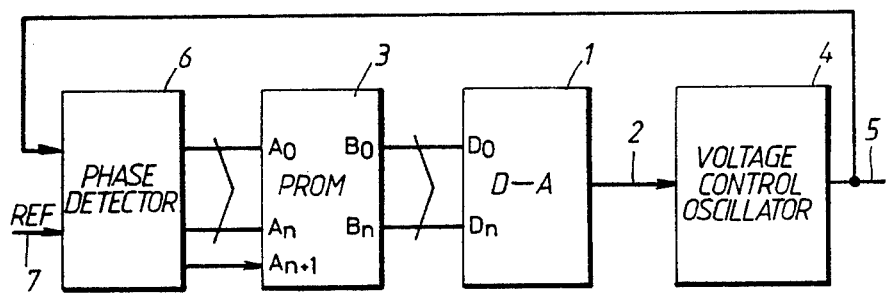
FIG. 3 shows a generator including a phase-lock loop which uses the control circuit of FIG. 2.

Referring now to FIG. 3, one specific use of the control circuit of FIG. 2 is in a phase-lock loop. An oscillator 4 of the kind the frequency of which is dependant on a voltage applied at an input thereof supplies an output 5 with an oscillatory signal. Part of the output signal from the voltage controlled oscillator (VCO) 4 is fed back to a phase detector 6 which compares the phase of the output signal with the phase of a reference signal supplied to an input 7.

The phase detector 6 produced a digital output signal which represents the phase difference between the output and reference signals. The digital output signal is passed to the address inputs Ao-An of the PROM 3 which responds in the manner of the control circuit of FIG. 2 to provide an appropriate digital signal to the digital to analogue converter 1 the output of which controls the VCO4.

Should the phase detector 6 detect an excessive phase difference between the output and reference signals it is arranged to cause a signal to be applied briefly to the address input A(n+1) which causes, as hereinbefore described, a step change in the voltage signal thereby causing an increase or decrease in the frequency of the output signal on the lead 5.

The signal on the address input A(n+1) is applied briefly so that the VCO4 procedures a frequency "kick" after which the signal at the input A(n+1) is removed returning the control voltage to its previous level. The frequency of the VCO4 therefore returns to its previous value with a different phase. The more usual phase correction procedure may now be used to maintain phase synchronism between the output and reference signals.

Whilst as herein described the PROM 3 is used any other suitable memory device may be used for example other kinds or read-only memory (ROM) such as EPROMs. The advantage of such memory devices is that they may be readily adapted to specific applications, but if desired the memory device may be replaced by a hardwire device where the relationship between input and output signals is unlikely to change.

Figure 4:
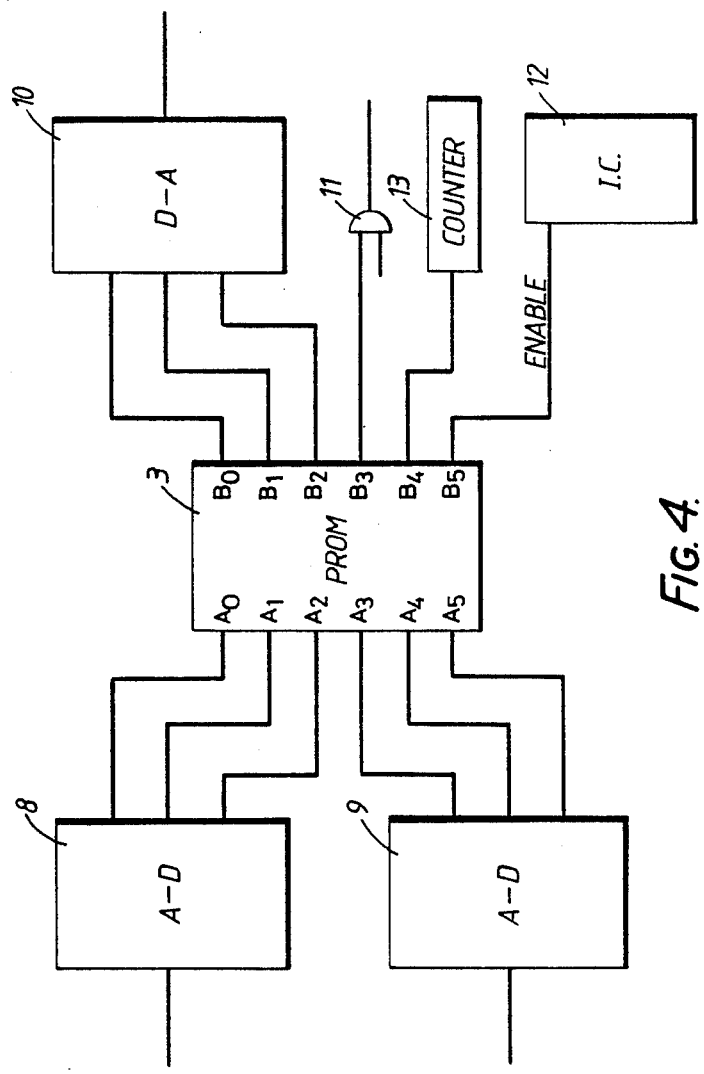
FIG. 4 is a schematic diagram of a control circuit in accordance with the invention shown in use as a comparator; and, FIG. 5 is a schematic diagram of a control circuit in accordance with the invention employed in a phase-locked loop.

Referring to FIG. 4 an alternative use of the PROM 3 only will now be described. In the use of now to be described the address inputs Ao-An are divided in to two groups each n long.

By applying a first digital value to the address inputs Ao to An and a second digital value to the other address inputs and programming the addressed memory words according to the difference between the two values the two digital values may be scaled against each other to provide a digital output on the leads Bo-Bn which output may be used for any control purpose.

Thus, if two different voltages are applied to respective analogue to digital converters (8, 9) using the digital signals to address the PROM 3 the voltages may be scaled against one another.

The quality of the voltage may produce a '1' output on one or more of the output leads Bo-Bn whilst one different (say one voltage greater than the other) produces a particular digital output and another difference (say the other voltage being greater than the first said one) produces a different particular digital output. The digital output may also be varied in dependence on voltage difference as well as a simple "greater or lesser" comparison.

The digital output signals on the leads Bo-Bn may be course each be used to control a different part of a circuit since it is not essential that the PROM 3 be programmmed in a logical numerical sequence. Thus as shown in FIG. 4 outputs Bo, B1 and B2 are connected to a digital to analogue converter 10 to provide an output analogue signal whilst outputs B3 and B5 provide enabling signals respectively to a logic gate 11 and another integrated circuit 12, the remaining output B4 being applied to an event counter 13.

Referring now to FIG. 5, there is shown a further embodiment of the invention wherein similar parts to those shown in FIG. 4 are indicated by the same reference numerals. The embodiment comprises a phase locked loop in which a modulating signal is frequency modulated onto a carrier wave.

A phase comparator 12 received a reference carrier wave signal at input 14 and a feedback signal at input 16 from a voltage controlled oscillator 18. The output of the phase comparator 12 represents a first signal A of the control circuit according to the invention and is applied to an analogue to digital converter 8 which provides a digital version of the first signal to a first address group $A_0-A_2$ of the address inputs $A_0-A_5$ of PROM 3. A second signal B representing a signal to be modulated onto the carrier signal is applied to an analog to digital converter A which provides a digital version of the signal to a second address group $A_3-A_5$ of the address inputs $A_0-A_5$. The memory locations of PROM 3 are preprogrammed to provide an output C on lines $B_0-B_5$ which represents a numeric value of the function $$C = A \cdot kB^{35} \quad 1$$

The digital value of signal C is converted to analog form in D-A converter 10 and applied as a control input to VCO 18.

Thus the effect of the circuit is to produce signal B frequency modulated onto the carrier signal.

The use of the PROM 3 permits great flexibility in the choice of modulation index and in addition permits rapid adjustment to large phase shifts.

We claim:

1. A phase locked loop circuit, the circuit including a phase comparator having first and second inputs and an output, a voltage controlled oscillator, having an input and output, and a control circuit having input means and output means, the first input of the phase comparator being coupled to a reference source, the second input of the phase comparator being coupled to the output of the voltage controlled oscillator, the output of the phase comparator being coupled to said input means of the control circuit, and the output means of the control circuit being coupled to the input of the voltage controlled oscillator;

the control circuit comprising a signal translating device, the device having n binary signals inputs and a predetermined number of binary signal outputs;

the signal inputs comprising first and second address groups, first and second signal means for applying first (A) and second (B) binary signals to the inputs of the respective first and second address groups;

the signal translating device providing a signal translating function such that said binary signal output are provided which are a predetermined function (C) of the first and second signals (A, B).

2. A circuit according to claim 1, wherein the signal translating device comprises a memory device having words preprogrammed therein which are addressed by said first and second address groups to provide an output having values which represent values of a predetermined function (C) of the first and second signals.

3. A circuit according to claim 2 wherein said words are preprogrammed according to the difference between the values of the first and secondary signals (A–B), such that the values are scaled against one another and said function is such that $C = A(kB)^{\pm 1}$, where k is a constant factor.

4. A circuit as claimed in claim 2 wherein sais memory device comprises a first storage area comprising n addressable words and a second storage area comprising n addressable words, wherein the signals applied to said first and second signal groups determine whether words from said first or second storage areas are provided as an output of the memory device.

5. A circuit according to claim 2 wherein said memory device has n address inputs to effect addressing of $2^n$ addressable words; said first address group comprises n/2 of said n address inputs; and said second address group comprises a different n/2 of said n address inputs and each of said $2^n$ addressable word stores a respective predetermined value derived from a comparison between a value output by said first address group and a value output by said second address group which values in combination address one of said $2^n$ addressable words to cause output of said respective predetermined value.

6. A circuit according to claim 1 wherein said first and second signal means comprise respective first and second analog to digital converters for receiving analog versions of the first and second signals and the control circuit including a digital to analog converter to which the output of the signal translating device is supplied to provide an analog output signal.

7. A circuit according to claim 6 wherein said output of the digital to analog converter is connected for control of the voltage controlled oscillator, the output of the phase comparator providing said first binary signal (A) and being connected to said first analog to digital converter, and said second signal (B) providing a modulating signal for the phase locked loop applied to said second analog to digital converter.

* * * * *